United States Patent [19]

Kashyap et al.

[11] Patent Number: 5,530,666
[45] Date of Patent: Jun. 25, 1996

[54] OPTICAL MEMORY

[75] Inventors: Raman Kashyap; Robert J. Campbell, both of Suffolk, England

[73] Assignee: British Telecommunications, plc, London, England

[21] Appl. No.: 39,487

[22] PCT Filed: Nov. 8, 1991

[86] PCT No.: PCT/GB91/01966

§ 371 Date: Mar. 30, 1993

§ 102(e) Date: Mar. 30, 1993

[87] PCT Pub. No.: WO92/09078

PCT Pub. Date: May 29, 1992

[30] Foreign Application Priority Data

Nov. 8, 1990 [GB] United Kingdom ............. 9024327

[51] Int. Cl.$^6$ .......................... G11C 11/21; G11C 13/04
[52] U.S. Cl. ...................... 365/123; 365/120; 365/215; 365/234; 359/34; 364/822
[58] Field of Search .................... 365/120, 127, 365/123, 124, 215, 234; 359/34, 109, 111, 118, 130; 364/822, 713

[56] References Cited

U.S. PATENT DOCUMENTS

| | | | |
|---|---|---|---|
| 3,675,157 | 7/1972 | Kaminow et al. | |
| 3,876,990 | 4/1975 | Silverman | 365/120 |
| 3,891,302 | 6/1975 | Dabby et al. | |
| 3,912,391 | 10/1975 | Fleisher et al. | 365/120 |
| 4,247,914 | 1/1981 | Brody | 365/234 |
| 4,415,226 | 11/1983 | Verber et al. | 364/822 X |
| 4,474,427 | 10/1984 | Hill et al. | |
| 4,593,969 | 6/1986 | Goodman et al. | |
| 4,636,031 | 1/1987 | Schmadel, Jr. et al. | |
| 4,787,693 | 11/1988 | Kogelnik et al. | 359/118 |
| 4,794,617 | 12/1988 | Boeck | |
| 4,815,804 | 3/1989 | Desurvire et al. | 350/96.15 |
| 4,856,862 | 8/1989 | Passmore et al. | 350/96.15 |
| 4,996,419 | 2/1991 | Morey | |
| 5,016,967 | 5/1991 | Meltz et al. | |
| 5,061,032 | 10/1991 | Meltz et al. | |
| 5,099,347 | 3/1992 | Daniele et al. | 359/117 |
| 5,208,877 | 5/1993 | Murphy et al. | |

FOREIGN PATENT DOCUMENTS

| | | |
|---|---|---|
| 0286350 | 10/1988 | European Pat. Off. |
| 2162836 | 2/1986 | United Kingdom |
| WO86/01303 | 2/1986 | WIPO |

OTHER PUBLICATIONS

PCT Search Reports, *European Patent Office*, completed Feb. 10–11, 1992.
Electronics Letters, vol. 22, No. 19, pp. 987–988, Sep. 1986.
Optics Letters, vol. 3, No. 2, pp. 66–68, Aug. 1978.
Ragdale et al, SPIE, vol. 1171, *Fiber Laser Sources and Amplifiers* (1989).
Yeh et al, *Applied Optics*, vol. 19, No. 16, pp. 2848–2855, Aug. 1990.
LaRochelle et al, *Optics Letters*, vol. 15, No. 7, pp. 399–401, Apr. 1, 1990.
Matsuhara et al, *Journal of the Optical Society of America*, vol. 65, No. 7, pp. 804–809, Jul. 1975.
Matsuhara et al, *Applied Optics*, vol. 13, No. 12, pp. 2886–2888, Dec. 1974.
Hill, *Applied Optics*, vol. 13, No. 8, pp. 1853–1856, Aug. 1974.
Cross et al, *Optics Letters*, vol. 1, No. 1, pp. 43–45, Jul. 1977.
Stone, *J. Appl. Phys.*, vol. 62, No. 11, pp. 4371–4374, Dec. 1, 1987.
Hill et al, *Appl. Phys. Lett.*, vol. 32, No. 10, pp. 647–649, May 15, 1978.
Hand et al, *Optics Letters*, vol. 15, No. 2, pp. 102–104. Jan. 15, 1990.

*Primary Examiner*—David C. Nelms
*Assistant Examiner*—Huan Hoang
*Attorney, Agent, or Firm*—Nixon & Vanderhye

[57] ABSTRACT

The present invention is based on the use of a plurality of gratings recorded in an optical waveguide, the gratings having different Bragg wavelengths selected to store individual bits of data. The invention has particular application to optical fiber communications networks.

21 Claims, 2 Drawing Sheets

OPTICAL MEMORY

This application is related to commonly assigned application Ser. No. 08/050,194, now U.S. Pat. No. 5,384,884, naming Kashyap and Campbell as inventors and filed May 4, 1993.

This invention relates to optical memories, that is memories in which information is represented as a modification of an optical property of the memory.

BACKGROUND AND SUMMARY OF THE INVENTION

In this specification the term "optical" is intended to refer to that part of the electromagnetic spectrum which is generally known as the visible region together with those parts of the infra-red and ultraviolet (UV) regions at each end of the visible region which are capable of being transmitted by dielectric optical waveguides such as optical fibres.

The present invention is based on the use of a plurality of gratings recorded in an optical fibre, the gratings having different Bragg wavelengths selected to store individual bits of data. The invention has particular application to optical fibre communication networks.

Advantageously, the optical memory further comprises read means for determining which, if any, fibre gratings are present. Other aspects of the present invention are as recited in the claims of this application, and are directed to optical communications systems incorporating an optical memory according to the present invention.

K. O. Hill, Y. Fujii, D. C. Johnson and B. S. Kawasaki first reported permanent, optically-induced changes of the refractive index of optical fibres in a paper entitled "Photosensitivity in optical fiber waveguides: Application to reflection filter fabrication." In their experiment, coherent radiation at 514.5 nm, reflected from the fibre ends, generated a standing wave in the fibre which induced a periodic refractive index change along its length. This formed a high reflectivity Bragg grating in the fibre which has a peak at the wavelength of the incident beam. Since then, numerous studies into the grating growth mechanism and photosensitive fibres have been carried out. However, the mechanism which results in the perturbation to the refractive index of the fibre core is not fully understood. The spectral region where the fibre is photosensitive has been found to range from the UV to around 500 nm.

B. S. Kawasaki, K. O. Mill, D. C. Johnson and Y. Fujii in an article titled "Narrow-band Bragg reflectors in optical fibres", Optics Letters Vol 8 No. 2 August 1978, pp 66–68 noted that an important property of the grating formation process is the extent to which the filter response can be tailored. For example, one method of forming a complex filter is to superimpose two or more simple band-stop characteristics in the same fibre by illuminating the fibre with different wavelengths of light either simultaneously or consecutively.

An alternative method forming two Bragg gratings is to apply a different longitudinal stress to the fibre before optically writing each grating, all the gratings having the same Bragg condition at the time of writing.

This method of writing two or more gratings has the advantage of obviating the need for multiple wavelength illumination.

The property used in this method is to exploit the fact that optical fibre can theoretically be linearly strained by up to 20%. If a photosensitive fibre, length 1, is illuminated by a light from a laser of wavelength $\lambda_0$, this will result in a grating of period about $\lambda_0/2n_{eff}$, where $n_{eff}$ is the fibre mode refractive index. If the fibre is now stretched by $\Delta l$; then, when illuminated, a grating of similar pitch to before will be written. By allowing the fiber to relax to its normal length, the pitch of this second grating will now be slightly smaller than the first grating. For the case of a reflection filter, the second grating has a peak wavelength which is smaller than the writing wavelength.

It may also be possible to write reflection gratings for use at the telecommunications bandwidth of 1.3–15 µm, if the fibre can be stretched by approximately 10%. This is still within the theoretically predicted change; but, due to defects in the manufacture of the fibre, it is not clear whether it is possible to do this. Other materials, such as photorefractive materials, may also be used as a data storage medium for the purposes described here.

A convenient method of applying the different longitudinal stresses to the fibre to produce the different stains is to clamp one end of the fibre, and to apply the stress by means of a piezo-electric translation stage clamped to the other end of the fibre. Clearly, other stressing means may be used.

DESCRIPTION OF THE DRAWINGS

Embodiments of these and other aspects of the present invention will now be described, by way of example, with reference to the accompanying drawings, in which.

DESCRIPTION OF THE PREFERRED EMBODIMENTS

The figures show an exemplary application of the use of an optical fibre waveguide as an optical data store for storing information, in which a plurality of gratings are recorded in the fibre, the gratings having predetermined different Bragg wavelengths selected so as to store individual bits of data in the fibre.

Figure 1:
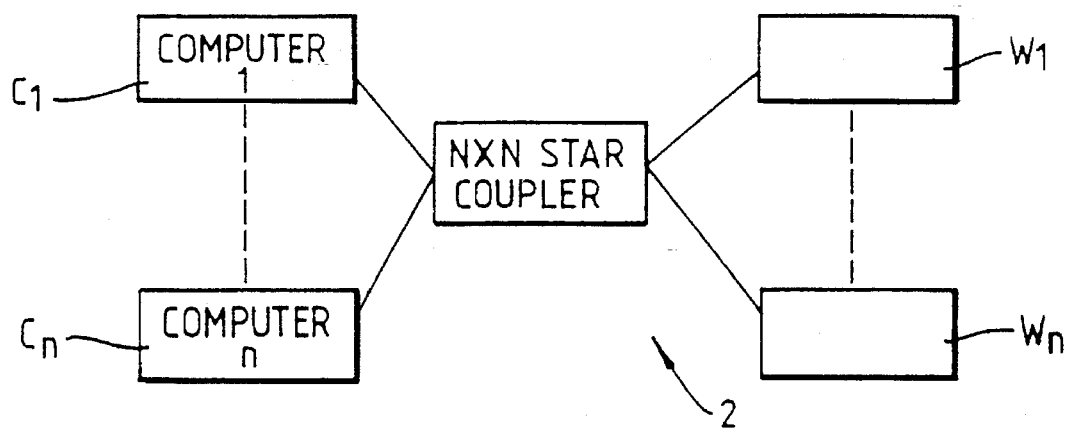
FIG. 1 is a schematic diagram of a data/communication network (a network of computers)

Referring to FIG. 1, an optical fibre NXN star coupler network 2 connects computers $C_l$ to $C_n$ to a series of work stations $W_1$ to $W_A$. Each workstation $W_1$ of FIG. 1 has associated with it a unique address. Each computer $C_l$–$C_n$ can broadcast information signals via the network 2 to every workstation $W_1$–$W_A$ each signal consisting of a header frame followed by data. In this system, the data has a different wavelength band to that of an associated header frame.

Figure 2:
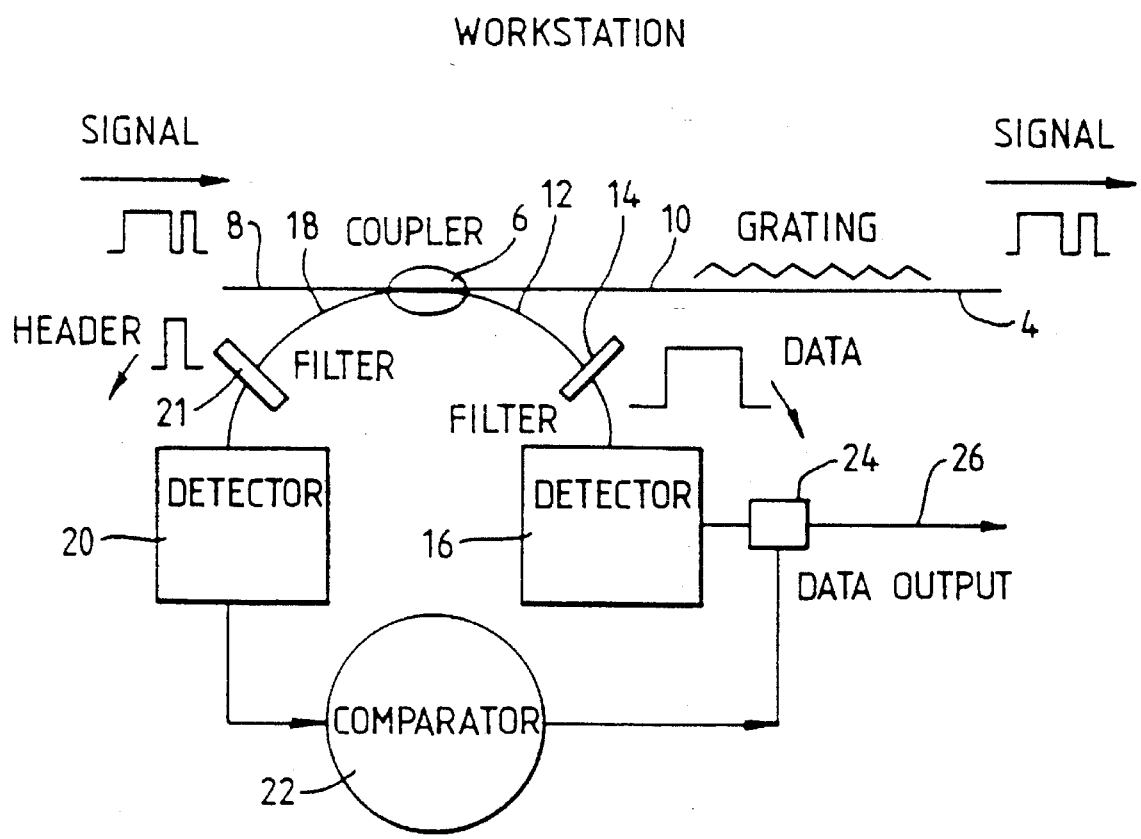
FIG. 2 is a schematic diagram of an optical memory used to control access to the computers of FIG. 1.
Figure 3:
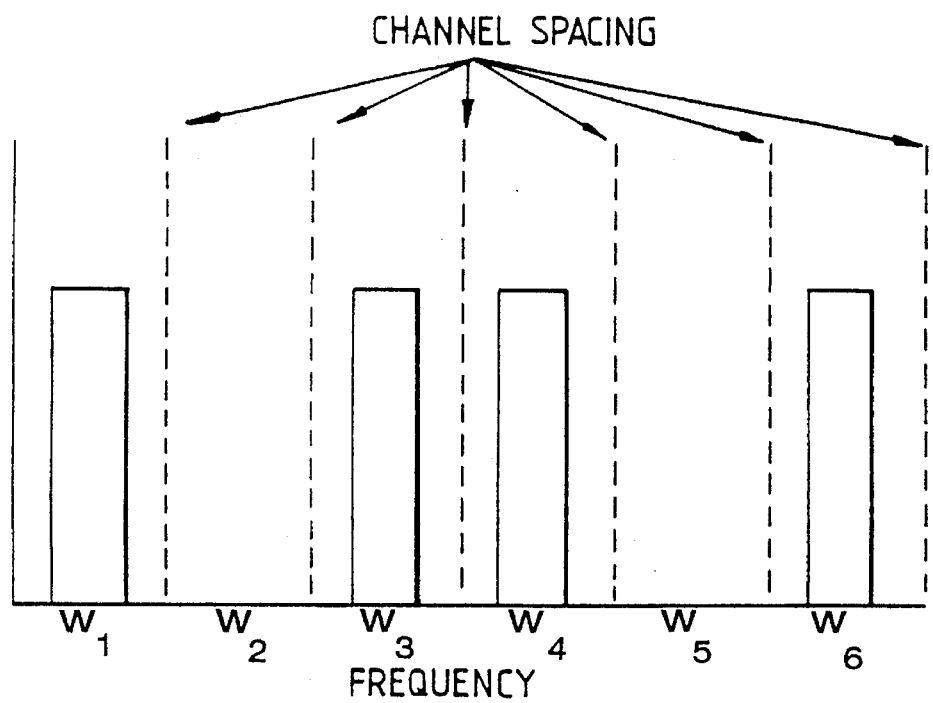
FIG. 3 is a diagram showing the frequency grating pattern of the optical memory of FIG. 2.

FIG. 2 shows the detection system of a workstation $W_1$. The workstation $W_j$ has its address written in an optical fibre waveguide 4 in the form of a superposition of grating patterns selected from wavelengths $W_1$ to $W_6$ as shown in FIG. 3. In this case, the fibre 4 has gratings corresponding to Bragg wavelengths $W_1$, $W_3$, $W_4$ and $W_6$, that is to say the address of the workstation $W_1$ is stored in the fibre 4 by the presence of gratings having the aforementioned Bragg wavelengths.

Figure 4:
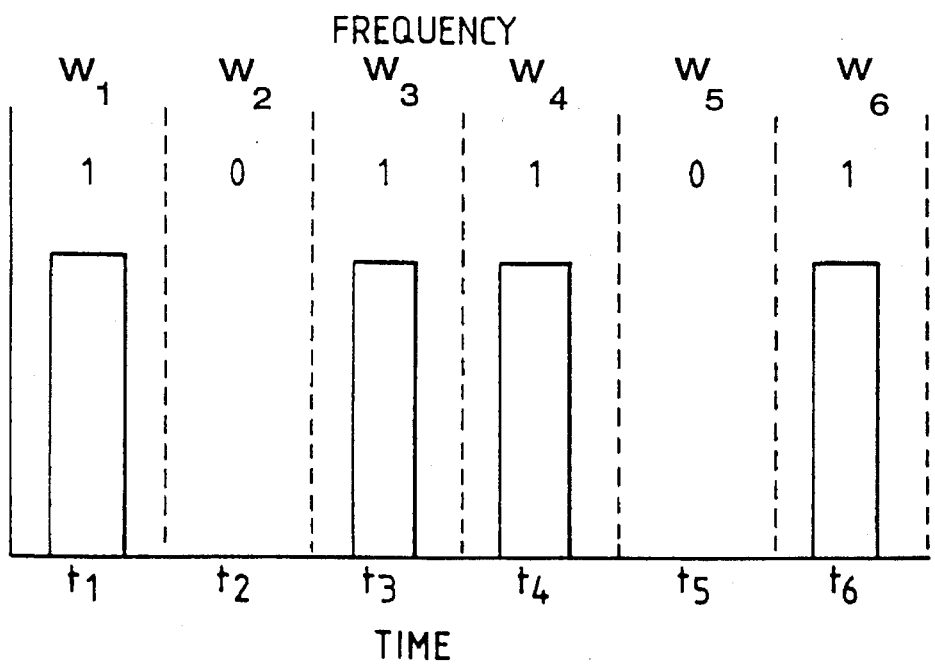
FIG. 4 is a diagram of a header for an information packet of the network of FIG. 1.

The header frame of a data packet consists of a number of time slots, each of which is set aside for a particular wavelength $W_1$ to $W_6$, see FIG. 4.

Data packets from the star coupler network 2 are coupled to an input port 8 of a four-port directional coupler 6. One output port 10 of the coupler 6 is spliced to the fibre 4. The other output port 12 of the coupler 6 is coupled to a band-pass filter 14 and a detector 16 in series. The filter 14 allows only the data signal to reach the detector 16 by blocking the header wavelengths $W_1$ to $W_6$.

When a header frame is coupled to the fibre 4, wavelengths therein that correspond to the Bragg wavelengths of the gratings of the fibre will be reflected back towards the coupler 6 with wavelength $W_1$, being reflected at time $t_1$, if present in the header.

The reflected signals are coupled into a second input port 18 of the coupler 6 and go to a detector 20. The detected time sequential pulses derived from the header frame of the incoming signal are compared to the address of the workstation by a comparator 22. If they correspond, a gate 24 is opened to allow the received data from the detector 16 to be output at the electrical output line 26 connected to that detector via the gate 24. The system operation has numerous operating regimes depending on the data/header wavelengths and timing used in the network and the number of gratings, that is to say one or more may be used to store the workstation address.

In this system, the amount of electronic processing of an incoming optical signal is significantly reduced, as the grating automatically selects the correct header wavelengths. The fact that this is done in a fibre which is part of the network, also removes problems which would occur if it were to be done outside the fibre, for example in the alignment of optical components. The system itself is similar in some ways to wavelength division multiplexing (WDM), in that the destination of the signal is dependent on the wavelength of the signal and the use of wavelength selective filters. However, unlike a WDM system, the actual data itself is transmitted at the same wavelength to every workstation, as it is only the header frame which varies in wavelength content. This means that receivers can potentially detect all the signals in the network, which is important if a single workstation needs to read the data for more than one user.

In some networks, it is necessary for the same data to be sent to a number of users, for example from a head office to branches. It is more efficient if the information is only transmitted once. This is possible if another set of address gratings is written in the fibre but physically removed from the individual user's address. This second, generally broadcast, address has a different wavelength band to the one used for individual user numbers, so as to avoid interference between signals. In this way, information which is required to go to a number of different addresses can be sent as one data stream.

To give an example of the number of different workstations that could potentially be addressed using a fiber grating optical data stores, consider a network where the data and header are being transmitted at 1, 3 and 1.5 μm respectively. The wavelength range over which an address is written is obviously dependent on the bandwidth of each diffraction grating. This is taken, in this example, to be 0.1 nm and the total wavelength range for the addresses is assumed to be 10 nm. This gives 100 channels, for the address gratings.

Another envisaged use of the grating addressed system is for the re-routing of signals in a transmission system. This has the great advantage that header frames can be read giving all the details of where the signal is to be redirected, while the actual data itself can be kept in an optical form. The data packet can be given a new header frame as it is routed through the switching system. This eliminates the need to convert the data from optics to electronics and back again, which is expensive and limits the data rate.

The above embodiments are exemplary of specific uses of an optical fiber waveguide as an optical data store for storing information, in which the information is stored by means of fiber gratings having distinct, predetermined Bragg wavelengths. The data can be stored in terms of both the presence and the absence of gratings with distinct predetermined Bragg wavelengths.

Numerous alternative configurations and applications of optical data stores according to the present invention will be apparent to those skilled in the art; and, while the invention has been described in connection with what is presently considered to be the most practical and preferred embodiments, it is to be understood that the invention is not to be limited to the disclosed embodiments, but on the contrary, is intended to cover any such alternative configurations and uses, various modifications and equivalent arrangements which fall within the spirit and scope of the appended claims.

We claim:

1. An optical memory system comprising:

an optical waveguide;

a plurality of gratings recorded in the waveguide, said gratings having predetermined different Bragg wavelengths selected so as to store individual bits of data in the waveguide; and reading means for reading the stored data bits from the waveguide, comprising optical source means for directing optical radiation into the waveguide, and detector means for detecting optical radiation at said Bragg wavelengths upon being defracted thereto by the gratings from the source means.

2. An optical memory system as claimed in claim 1 further comprising a coupler disposed in the waveguide for receiving reflections from said gratings and coupling them to said detector means.

3. An optical memory system as claimed in claim 2 further comprising a comparator coupled to said detector means for comparing detected data bits output from said detector means with reference data bits stored at the comparator.

4. An optical memory as claimed in claim 1 wherein the bits of data stored in said gratings are address information whereby a first set of address gratings are present.

5. An optical memory system as claimed in claim 4 further comprising a second set of address gratings.

6. An optical memory system as claimed in claim 5 wherein said second set of address gratings are physically removed from said first set of address gratings.

7. An optical memory comprising:

an optical waveguide;

a plurality of gratings recorded in the waveguide, said gratings having predetermined different Bragg wavelengths selected so as to store individual bits of data in the waveguide; and whereby said stored data bits are read from the waveguide by utilizing an optical source means for directing optical radiation into the waveguide, and detector means for detecting optical radiation at said Bragg wavelengths upon being defracted thereto by the gratings from the source means.

8. An optical memory system as claimed in claim 7, in which the optical waveguide comprises a photorefractive fibre, the or each fibre grating being an internal grating.

9. An optical memory system as claimed in claim 7, in which the gratings are reflection gratings.

10. An optical communications network comprising a series of workstations each having an associated address, the addresses each being stored in an optical memory system as claimed in claim 7.

11. An optical communications network as claimed in claim 10, in which there are two or more broadcasting terminals, each terminal broadcasting signals to each of the workstations.

12. A communications network as claimed in claim 10, in which data signals for the workstations each comprise a header frame followed by a data frame, each data frame having a different wavelength band to that of the associated header frame.

13. A communications network as claimed in claim 12, in which each header frame consists of a number of time slots, each of which is set aside for a particular distinct wavelength.

14. A communications network as claimed in claim 12, in which the address of a workstation to which data is addressed is coded as series of wavelengths in the header frame, said wavelengths corresponding to the Bragg wavelengths of the gratings.

15. A communications network as claimed in claim 14, in which said wavelengths are chosen from a set of a plurality of predetermined wavelengths.

16. A communications network as claimed in claim 12, in which each workstation includes a bandpass filter which blocks the wavelengths of the header frames.

17. An optical communications network as claimed in claim 16, in which the data from a data frame is coupled from a detector to a workstation only if the address and the data header corresponds to the address of that workstation.

18. A communications network as claimed in claim 16, further comprising means for detecting which wavelengths of a header frame are back reflected by the filter.

19. A communications network as claimed in claim 18, in which the reflected signals from said header frame are detected as a series of time-sequential pulses, the detected pulses being compared to the address of the workstation by a comparator.

20. A method of reading data stored in an optical waveguide as a plurality of gratings recorded in the waveguide, said gratings having predetermined different Bragg wavelengths selected so as to store individual items of data, the method comprising reading the stored data by directing optical radiation from a source thereof into the waveguide, and detecting optical radiation at said Bragg wavelengths upon being defracted thereto by the gratings from the source means.

21. A method as in claim 20 wherein said directing optical radiation from a source includes directing radiation of particular wavelengths in predetermined time slots.

* * * * *